(12) United States Patent
Nishibayashi et al.

(10) Patent No.: US 10,639,725 B2
(45) Date of Patent: May 5, 2020

(54) COMPOSITE DIAMOND BODY AND COMPOSITE DIAMOND TOOL

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Akihiko Ueda, Itami (JP); Yutaka Kobayashi, Itami (JP)

(73) Assignees: Sumitomo Electric Industries, Ltd., Osaka-shi (JP); Sumitomo Electric Hardmetal Corp., Itami-shi (JP)

(*) Notice: Subject to any disclaimer, the term of this patent is extended or adjusted under 35 U.S.C. 154(b) by 221 days.

(21) Appl. No.: 15/522,938

(22) PCT Filed: Oct. 29, 2015

(86) PCT No.: PCT/JP2015/080537
§ 371 (c)(1),
(2) Date: Apr. 28, 2017

(87) PCT Pub. No.: WO2016/068231
PCT Pub. Date: May 6, 2016

(65) Prior Publication Data
US 2017/0320144 A1 Nov. 9, 2017

(30) Foreign Application Priority Data
Oct. 29, 2014 (JP) .................. 2014-219991

(51) Int. Cl.
*B23B 27/20* (2006.01)
*C30B 29/04* (2006.01)
(Continued)

(52) U.S. Cl.
CPC ............ *B23B 27/20* (2013.01); *B23B 27/148* (2013.01); *C23C 14/0617* (2013.01);
(Continued)

(58) Field of Classification Search
None
See application file for complete search history.

(56) References Cited

U.S. PATENT DOCUMENTS

| 3,378,393 A | 4/1968 | Roberts |
| 5,224,969 A | 7/1993 | Chen et al. |

(Continued)

FOREIGN PATENT DOCUMENTS

| CN | 101680076 A | 3/2010 | |
| EP | 0166708 A2 * | 1/1986 | ......... C23C 16/0272 |

(Continued)

*Primary Examiner* — David Sample
*Assistant Examiner* — Elizabeth Collister
(74) *Attorney, Agent, or Firm* — Baker Botts L.L.P.; Michael A. Sartori

(57) ABSTRACT

A composite diamond body includes a diamond base material and a stable layer disposed on the diamond base material. The stable layer may have a thickness of 0.001 μm or more and less than 10 μm, and may include a plurality of layers. A composite diamond tool includes the composite diamond body. There are thus provided highly wear-resistant composite diamond body and composite diamond tool that are even applicable to mirror-finish planarization of a workpiece which reacts with diamond to cause the diamond to wear.

2 Claims, 4 Drawing Sheets

(51) Int. Cl.
    *C23C 14/58* (2006.01)
    *C30B 31/22* (2006.01)
    *C23C 14/18* (2006.01)
    *C23C 14/06* (2006.01)
    *C23C 14/48* (2006.01)
    *C23C 16/06* (2006.01)
    *C23C 16/27* (2006.01)
    *B23B 27/14* (2006.01)
    *C23C 14/35* (2006.01)
    *C30B 25/00* (2006.01)

(52) U.S. Cl.
    CPC ...... *C23C 14/0635* (2013.01); *C23C 14/0641* (2013.01); *C23C 14/18* (2013.01); *C23C 14/185* (2013.01); *C23C 14/352* (2013.01); *C23C 14/48* (2013.01); *C23C 14/5806* (2013.01); *C23C 16/06* (2013.01); *C23C 16/27* (2013.01); *C30B 25/00* (2013.01); *C30B 29/04* (2013.01); *C30B 31/22* (2013.01); *B23B 2222/68* (2013.01); *B23B 2222/72* (2013.01); *B23B 2222/84* (2013.01); *B23B 2226/31* (2013.01); *B23B 2226/315* (2013.01); *B23B 2228/04* (2013.01); *B23B 2228/36* (2013.01); *B23B 2240/08* (2013.01)

(56) References Cited

U.S. PATENT DOCUMENTS

| | | | |
|---|---|---|---|
| 5,232,469 A | 8/1993 | McEachron et al. | |
| 5,853,888 A * | 12/1998 | Dutta | C23C 14/081 428/408 |
| 5,855,967 A | 1/1999 | Kirkpatrick | |
| 6,779,951 B1 * | 8/2004 | Vale | B22F 7/06 407/119 |
| 2008/0134959 A1 * | 6/2008 | Kasu | C23C 16/274 117/84 |
| 2010/0143054 A1 | 6/2010 | Pretorius et al. | |
| 2010/0167044 A1 | 7/2010 | Pretorius et al. | |
| 2010/0175613 A1 * | 7/2010 | Noguchi | C30B 25/18 117/101 |
| 2010/0206941 A1 | 8/2010 | Egan et al. | |
| 2011/0171444 A1 * | 7/2011 | Elkouby | C23C 14/024 428/216 |
| 2014/0137795 A1 | 5/2014 | Chang et al. | |
| 2014/0290145 A1 | 10/2014 | Zhuk et al. | |
| 2014/0341664 A1 * | 11/2014 | Meguro | C23C 16/271 407/119 |

FOREIGN PATENT DOCUMENTS

| | | | |
|---|---|---|---|
| JP | 03-232973 A | 10/1991 | |
| JP | 2005-324319 A | 11/2005 | |
| JP | 2010-520067 A | 6/2010 | |
| JP | 2010-527802 A | 8/2010 | |
| JP | 2010-240812 A | 10/2010 | |
| JP | 2012-086988 A | 5/2012 | |
| JP | 2013-035732 A | 2/2013 | |
| JP | 2018-502041 A | 1/2018 | |
| WO | WO-0179583 A2 * | 10/2001 | ............. C23C 14/48 |
| WO | 2008/104944 A1 | 9/2008 | |
| WO | 2008/142657 A1 | 11/2008 | |
| WO | 2016114716 A1 | 7/2016 | |

* cited by examiner

COMPOSITE DIAMOND BODY AND COMPOSITE DIAMOND TOOL

TECHNICAL FIELD

The present invention relates to a composite diamond material, a composite diamond body, and a composite diamond tool that are used for cutting, grinding, and the like.

BACKGROUND ART

Diamond tools have high hardness which has been utilized to machine materials such as Al, Al alloy, Mg, and Mg alloy for cutting, grinding, and the like. Because surfaces finished by diamond tools are remarkably aesthetic, the diamond tools have been used for cutting and grinding technologies requiring no polishing. However, diamond tools have been extremely bad at machining oxides and iron. This is because carbon has a high tendency to bond with oxygen and because carbon reacts with iron and accordingly diamond is likely to wear. A tool of diamond or the like capable of machining oxides and iron can be a very useful tool.

In order to suppress wear of diamond, Japanese Patent Laying-Open No. 3-232973 (PTD 1) discloses a diamond tool having a surface of diamond such as sintered diamond coated with a hard surface layer of $Al_2O_3$, TiN, ZrN, BN or the like. Moreover, Japanese Patent Laying-Open No. 2010-240812 (PTD 2) discloses a surface-coated cutting tool including a base material such as diamond sintered body and a coating formed on the base material. The coating is a physically vapor-deposited film and includes a nitride layer with a thickness of 7 to 15 μm formed on the base material, a composite wear-resistant layer with a thickness of 3 to 10 μm formed on the nitride layer, and an AlN layer with a thickness of 0.2 to 5 μm formed on the composite wear-resistant layer. In the composite wear-resistant layer, a carbonitride thin layer with a thickness of 0.2 to 1.5 μm and a thin nitride film with a thickness of 0.2 to 1.5 μm are alternately laid on one another. Moreover, Japanese National Patent Publication No. 2010-527802 (PTD 3) discloses a coated diamond including: a diamond base material; a first carbide layer of a carbide-forming element; a second layer of a refractory metal selected from the group consisting of W, Mo, Cr, and the like, or a combination or an alloy thereof, substantially excluding the carbide-forming element of the first carbide layer; and an overcoating of Ag, Ni, Cu, or the like, or a combination or an alloy thereof, in which the metal is different from the metal of the second layer.

CITATION LIST

Patent Document

PTD 1: Japanese Patent Laying-Open No. 3-232973
PTD 2: Japanese Patent Laying-Open No. 2010-240812
PTD 3: Japanese National Patent Publication No. 2010-527802

SUMMARY OF INVENTION

Technical Problem

Regarding Japanese Patent Laying-Open Nos. 3-232973 (PTD 1) and 2010-240812 (PTD 2), sintered diamond or diamond sintered body is used as the diamond of the base material. In the sintered body, a binder is included, which leads to the following problems. Namely, gaps are present at grain boundaries and the surface is highly uneven, and therefore, even when a coating is formed on the base material, the surface flatness and the end machining precision are low, which makes the diamond unsuitable for precision machining and mirror-finish planalization.

Regarding Japanese Patent Laying-Open No. 2010-240812 (PTD 2) and Japanese National Patent Publication No. 2010-527802 (PTD 3), it is necessary to form a coating having a complicated layer structure made up of three or more layers, which leads to problems that the cost is high and the incidence of defects such as layer peeling is high. In particular, there has been a problem in adhesion to a workpiece's end which needs high precision.

In view of the above, it is an object to solve the above-described problems and thereby provide highly wear-resistant composite diamond body and composite diamond tool that are even applicable to mirror-finish planarization of a workpiece which reacts with diamond to cause the diamond to wear.

Solution to Problem

A composite diamond body in accordance with an aspect of the present invention includes: a diamond base material; and at least one stable layer located in at least one of a position on the diamond base material and a position in an inner region from a surface of the diamond base material to occupy at least a part of the diamond base material. The stable layer may have a thickness of 0.001 μm or more and less than 10 μm. The stable layer may include a plurality of layers. The stable layer may include at least one kind of metal selected from the group consisting of tungsten, tantalum, molybdenum, niobium, vanadium, chromium, titanium, zirconium, and hafnium. The stable layer may also include at least one kind of metal selected from the group consisting of ruthenium, osmium, rhodium, iridium, palladium, and platinum. The stable layer may also include at least one kind of carbide selected from the group consisting of tungsten carbide, tantalum carbide, molybdenum carbide, niobium carbide, vanadium carbide, chromium carbide, titanium carbide, zirconium carbide, hafnium carbide, and silicon carbide. The stable layer may include at least one layer which is a deposited layer disposed on the diamond base material. The stable layer may also include at least one layer which is an ion-implanted layer disposed in the inner region from the surface of the diamond base material to occupy at least a part of the diamond base material. The stable layer may also include at least one layer which is an annealed layer disposed in the inner region from the surface of the diamond base material to occupy at least a part of the diamond base material. In the composite diamond body in accordance with this aspect, the diamond base material may be formed of at least one of synthetic single crystal diamond and synthetic polycrystalline diamond. The diamond base material may be formed of vapor-phase-synthesized diamond having a non-substitutional nitrogen concentration of more than 1 ppm. The composite diamond body may further include a diamond surface layer disposed on the stable layer and having a thickness of 5 μm or less.

A composite diamond tool in accordance with another aspect of the present invention includes a composite diamond body in accordance with the above aspect.

Advantageous Effects of Invention

As seen from the above, there can be provided highly wear-resistant composite diamond body and composite diamond tool that are even applicable to mirror-finish planarization of a workpiece which reacts with diamond to cause the diamond to wear.

DESCRIPTION OF EMBODIMENTS

Description of Embodiments of the Invention

Figure 1:
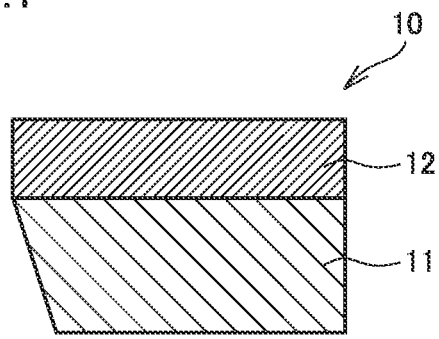
FIG. 1 is a schematic cross-sectional view showing an example of the composite diamond body in accordance with an aspect of the present invention.

A composite diamond body in accordance with an embodiment of the present invention includes a diamond base material and at least one stable layer disposed in at least one of a position on the diamond base material and a position in an inner region from a surface of the diamond base material to occupy at least a part of the diamond base material. The composite diamond body in accordance with the present embodiment includes the diamond base material and the stable layer disposed on the diamond base material and/or in the inner region from the surface of the diamond base material to occupy at least a part of the diamond base material, to thereby hinder reaction between a workpiece and the diamond base material. Therefore, the composite diamond body is high in wear resistance and applicable to even mirror-finish planarization of a workpiece. The composite diamond body is high in thermal conductivity and therefore the temperature of a machining part can be kept low. The stable layer herein refers to a layer formed of an element of a different kind from the diamond base material, or broadly refers to a layer different from the diamond base material in terms of crystal structure, electrical, or chemical properties, even when the element for the stable layer is not different from the diamond base material. The stable layer is different in properties from the diamond base material to thereby impart durability (electrical, chemical, and mechanical properties) which cannot be obtained by the diamond base material alone.

In the composite diamond body of the present embodiment, the stable layer may have a thickness of 0.001 μm or more and less than 10 μm. The composite diamond body is thus high in hardness and therefore suitably applicable to mirror-finish planarization.

In the composite diamond body of the present embodiment, the stable layer may include a plurality of layers. Alternatively, in the interface between the stable layer and the diamond base material, the ratio between the element of the stable layer and the element of the diamond base material or respective characteristics of the stable layer and the diamond base material may vary gradually or stepwise. "Vary gradually" or "vary stepwise" means that the average of values obtained by a common measurement method (the average in a square area of 100 μm per side or more, for example) "varies continuously" or "varies stepwise." This also includes a state of the interface in which the diamond base material and the stable layer are locally separate from each other and the area ratio between the diamond base material and the stable layer varies in a microscopic area (less than 10 μm) relative to the aforementioned area of the average. Accordingly, the adhesion between the diamond base material and the stable layer can be increased.

In the composite diamond body of the present embodiment, the stable layer may include at least one kind of metal selected from the group consisting of tungsten, tantalum, molybdenum, niobium, vanadium, chromium, titanium, zirconium, and hafnium. Thus, the composite diamond body includes the stable layer having low reactivity with a workpiece and high wear resistance, and is therefore suitably applicable to mirror-finish planarization of a workpiece.

In the composite diamond body of the present embodiment, the stable layer may include at least one kind of metal selected from the group consisting of ruthenium, osmium, rhodium, iridium, palladium, and platinum. Thus, the composite diamond body includes the stable layer having low reactivity with a workpiece and high wear resistance, and is therefore suitably applicable to mirror-finish planarization of a workpiece.

In the composite diamond body of the present embodiment, the stable layer may include at least one kind of carbide selected from the group consisting of tungsten carbide, tantalum carbide, molybdenum carbide, niobium carbide, vanadium carbide, chromium carbide, titanium carbide, zirconium carbide, hafnium carbide, and silicon carbide. Thus, the composite diamond body includes the stable layer having low reactivity with a workpiece and high wear resistance, and is therefore suitably applicable to mirror-finish planarization of a workpiece.

In the composite diamond body of the present embodiment, the stable layer may include an inner stable layer located at a side of the diamond base material, and the inner stable layer may include at least one kind of metal selected from the group consisting of ruthenium, osmium, rhodium, iridium, palladium, and platinum. Thus, the composite diamond body includes the inner stable layer having high adhesion with the diamond base material, and is therefore suitably applicable to mirror-finish planarization of a workpiece.

In the composite diamond body of the present embodiment, the stable layer may include an inner stable layer located at a side of the diamond base material, and the inner stable layer may include at least one kind of carbide selected from the group consisting of tungsten carbide, tantalum carbide, molybdenum carbide, niobium carbide, vanadium carbide, chromium carbide, titanium carbide, zirconium carbide, hafnium carbide, and silicon carbide. Thus, the composite diamond body includes the inner stable layer with high adhesion with the diamond base material, and is therefore suitably applicable to mirror-finish planarization of a workpiece.

In the composite diamond body of the present embodiment, the stable layer may include at least one layer which is a deposited layer disposed on the diamond base material. The deposited layer herein refers to a layer formed by deposition. Thus, the composite diamond body includes the stable layer having low reactivity with a workpiece and high adhesion with the diamond base material.

In the composite diamond body of the present embodiment, the stable layer may include at least one layer which is an ion-implanted layer disposed in the inner region from the surface of the diamond base material to occupy at least a part of the diamond base material. The ion-implanted layer herein refers to a layer formed by ion implantation. Thus, the composite diamond body includes the stable layer having low reactivity with a workpiece and high adhesion with the diamond base material.

In the composite diamond body of the present embodiment, the ion-implanted layer may include separate portions located in respective multiple regions each having a diameter of less than 1 μm as seen in a direction perpendicular to the surface of the diamond base material. Thus, the composite diamond body includes the stable layer having low reactivity with a workpiece and high adhesion with the diamond base material.

In the composite diamond body of the present embodiment, the stable layer may include at least one layer which is an annealed layer disposed in a position on the diamond base material and a position in the inner region from the surface of the diamond base material to occupy at least a part of the diamond base material. The annealed layer herein refers to a layer formed by annealing the layer. Thus, the composite diamond body includes the stable layer having low reactivity with a workpiece and high adhesion with the diamond base material.

In the composite diamond body of the present embodiment, the diamond base material may be formed of at least one of synthetic single crystal diamond and synthetic polycrystalline diamond. Thus, the composite diamond body including the high-quality diamond base material is obtained.

In the composite diamond body of the present embodiment, the diamond base material may be formed of vapor-phase-synthesized diamond having a non-substitutional nitrogen concentration of more than 1 ppm. Thus, the composite diamond body including the high-quality diamond base material is obtained.

The composite diamond body of the present embodiment may further include a diamond surface layer disposed on the stable layer and having a thickness of 5 μm or less. Thus, even when the composite diamond body includes the diamond surface layer having a thickness of 5.0 μm or less, the presence of the stable layer under the diamond surface layer enables the composite diamond body to be used for machining a workpiece.

A composite diamond tool in accordance with another embodiment of the present invention includes the composite diamond body of the above-described embodiment. Since the composite diamond tool of the present embodiment includes the composite diamond body of the above-described embodiment, the tool can machine workpieces for a long period of time and is also applicable to mirror-finish planarization of a workpiece.

Details of Embodiments of the Invention

In the following, embodiments of the present invention will be described in detail with reference to the drawings. It should be noted that in the description referring to the drawings, the same components are denoted by the same reference characters, and a description thereof will not be repeated. The drawings are not to scale. In particular, the thickness of the stable layer is depicted larger, relative to the thickness of the diamond base material.

First Embodiment: Composite Diamond Body

As shown in FIGS. 1 to 11, a composite diamond body 10 of the present embodiment includes a diamond base material 11 and at least one stable layer disposed in at least one of a position on diamond base material 11 and a position in an inner region from a surface of the diamond base material to occupy at least a part of the diamond base material. Composite diamond body 10 in accordance with the present embodiment includes diamond base material 11 and stable layer 12 disposed on diamond base material 11 and/or in the inner region from the surface of the diamond base material to occupy at least a part of the diamond base material, to thereby allow stable layer 12 to hinder reaction between diamond base material 11 and a workpiece which reacts with diamond to cause the diamond to wear. Therefore, the composite diamond body is high in wear resistance. Since stable layer 12 is supported by diamond base material 11, the stable layer has high hardness, and the composite diamond body is even applicable to mirror-finish planarization of a workpiece. Moreover, since diamond base material 11 has high thermal conductivity, the temperature of the machining part can be kept low. Thus, composite diamond body 10 of the present embodiment has high wear resistance even against a workpiece which reacts with diamond to cause the diamond to wear. Moreover, the high thermal conductivity enables the composite diamond body to be applied even to mirror-finish planarization of the workpiece.

Diamond Base Material

Diamond base material 11 is not particularly limited. However, in order to increase the surface flatness, diamond base material 11 is preferably pure diamond containing no binder or the like ("pure diamond" is herein diamond having a purity of substantially 100%). Examples of the pure diamond may be single crystal diamond and polycrystalline diamond. Further, in order to further increase the surface flatness, diamond base material 11 is more preferably single crystal diamond without grain boundary. It should be noted that sintered diamond contains a binder and therefore has gaps at grain boundaries and large surface unevenness (arithmetic average roughness Ra defined by JIS B0601: 2013 is more than 100 nm, for example). The sintered diamond is therefore unsuitable for precision machining and mirror-finish planarization.

The diamond used for diamond base material 11 is not particularly limited. However, in order to obtain a uniform and homogeneous surface, diamond base material 11 is preferably formed of synthetic single crystal diamond and/or synthetic polycrystalline diamond, and more preferably formed of vapor-phase synthesized diamond. As to these single crystal diamond and polycrystalline diamond, synthetic single crystal diamond is more preferred, and vapor-phase-synthesized single crystal diamond is still more preferred, for a similar purpose to the above-described one. The reasons why the vapor-phase-synthesized single crystal diamond is preferred is: non-uniformity like that of natural single crystal diamond is avoided; and there is no growth sector like the one found in high-pressure synthesized single crystal diamond and a homogeneous surface can be formed.

More preferably, the vapor-phase-synthesized single crystal diamond has a non-substitutional nitrogen concentration of more than 1 ppm and/or a vacancy concentration of more than 1 ppm. This is for the reason that adhesion and/or reactivity between diamond base material 11 and stable layer 12 is increased. The non-substitutional nitrogen concentration herein refers to the concentration of nitrogen determined by subtracting the concentration of isolated substitutional nitrogen measured by the electron spin resonance (ESR) method from the total nitrogen concentration measured by the secondary ion mass spectrometry (SIMS). The vacancy concentration is a value evaluated through measurement based on the positron annihilation spectroscopy. The plane orientation of the face (rake face) of a tool for which the diamond base material is used may be approximately the (100) plane, approximately the (110) plane, or approximately the (111) plane. "Approximately" herein means that the plane is not limited to the exact plane, but includes planes with an off angle of more than 0° and less than 20°.

The diamond used as diamond base material 11 is neither a high-purity and high-quality diamond like that used for a semiconductor device, nor a diamond in which the doping concentration of boron (B) and/or phosphorus (P) is controlled. Namely, the diamond used as diamond base material 11 is a diamond in which the concentration of impurity mixed in the diamond and having no doping effect (particularly at least one kind of impurity selected from lithium (Li), beryllium (Be), nitrogen (N), aluminum (Al), silicon (Si), germanium (Ge), tin (Sn), tungsten (W), tantalum (Ta), molybdenum (Mo), niobium (Nb), chromium (Cr), and vanadium (V)) is preferably 10 ppb or more, more preferably 80 ppb or more, and still more preferably 1 ppm or more. Moreover, the diamond used as the diamond base material is a diamond in which vacancies are present at a concentration of preferably 50 ppb or more, more preferably 200 ppb or more, and still more preferably 1 ppm or more. Furthermore, the diamond used as the diamond base material has an average phase difference of crystal strain, namely optical strain (general index of optical strain) of preferably 1 nm or more, more preferably 5 nm or more, and still more preferably 30 nm or more. The average phase difference can be evaluated by means of WPA-100 manufactured by Photonic Lattice, with a resolution of 15 μm per pixel. Usually, in a diamond (any of natural diamond, high-pressure-synthesized diamond, and vapor-phase-synthesized diamond) having an internal strain distribution, the maximum phase difference is at least ten times as high as the average phase difference. Although none of such diamonds is suitable as a high-purity and high-quality diamond for a semiconductor device, they are diamonds effective for tools and can be used for tools.

Stable Layer

Stable layer 12 is not particularly limited as long as stable layer 12 has no or low reactivity with a workpiece and has high hardness. In the case where the workpiece is an iron-based material, stable layer 12 is preferably a layer containing at least one kind of metal (hereinafter also referred to as stable hard metal) selected from the group consisting of tungsten (W), tantalum (Ta), molybdenum (Mo), niobium (Nb), vanadium (V), chromium (Cr), titanium (Ti), zirconium (Zr), and hafnium (Hf), since these metals have low reactivity with iron and have higher hardness than iron. For the metal in the stable layer to have higher hardness, it is preferable that the metal has a higher melting point.

Stable layer 12 is also preferably a layer containing at least one kind of metal (hereinafter also referred to as stable refractory metal) selected from the group consisting of ruthenium (Ru), osmium (Os), rhodium (Rh), iridium (Ir), palladium (Pd), and platinum (Pt), since these metals are higher in melting point than iron, and expected to have low reactivity with iron and have higher hardness than iron. For the metal in the stable layer to have higher hardness, it is preferable that the metal has a higher melting point.

Stable layer 12 is also preferably a layer containing at least one kind of carbide (hereinafter also referred to as stable carbide) selected from the group consisting of tungsten carbide (WC), tantalum carbide (TaC), molybdenum carbide (MoC), niobium carbide (NbC), vanadium carbide (VC), chromium carbide (CrC), titanium carbide (TiC), zirconium carbide (ZrC), hafnium carbide (HfC), and silicon carbide (SiC), because although these materials are not electrically conductive, they have low reactivity with iron and/or oxygen and have a significantly higher hardness than metals like iron.

Stable layer 12 is also preferably a layer containing at least one kind of nitride (hereinafter also referred to as stable nitride) selected from the group consisting of titanium nitride (TiN), zirconium nitride (ZrN), hafnium nitride (HfN), aluminum nitride (AlN), and silicon nitride (SiN), because although these materials are not electrically conductive, they have low reactivity with iron and/or oxygen and have significantly higher hardness than metals like iron. As stable layer 12, a layer containing an oxide such as aluminum oxide ($Al_2O_3$) (hereinafter also referred to as stable oxide) having low reactivity with iron, or a layer containing a hard oxynitride such as silicon aluminum oxynitride (SiAlON) (hereinafter also referred to as stable oxynitride) may also be used.

Each of the above-described stable carbide, stable nitride, stable oxide, and stable oxynitride may be deviated from the stoichiometric ratio to some degree. Moreover, the stable layer may contain at least one of the above-described stable hard metal, stable refractory metal, stable carbide, stable nitride, stable oxide, and stable oxynitride. In order to have a smaller particle size and a higher flatness, stable carbide, stable nitride, stable oxide, and stable oxynitride are more preferred than stable hard metal and stable refractory metal. Deviation from the stoichiometric ratio to cause the metal ratio to be slightly higher and to cause electrical conductivity to be exhibited is more preferred, in order to prevent cracks of a material to be cut (improve toughness), sense contact with a workpiece, and prevent charging of the workpiece or the cutting material. Deviation from the stoichiometric ratio is preferably 0.1 atm % or more and less than 8 atom %, and the electrical conductivity imparted therefrom is preferably larger than $10^{-9}$ S/cm (resistivity: $10^9$ Ωcm). The electrical conductivity refers to an average electrical conductivity calculated from a current value when a stable layer with a thickness of 1 μm is formed on a Cu substrate with the same method, a Ti electrode of 1 mm in diameter is formed, and 50 V is applied.

Stable layer 12 may either be a single crystal layer, a polycrystalline layer, or an amorphous layer. In the case where stable layer 12 is a polycrystalline layer or amorphous layer, the particle size is preferably 1 μm or less, and more preferably 0.1 μm or less, in order to prevent or suppress scratches in a workpiece or generation of tarnish due to grain boundaries. It should be noted that preferably the particle size is smaller than the thickness of stable layer 12.

In order to prevent reaction between a workpiece and the diamond base material and keep the hardness of composite diamond body 10 high, the thickness of stable layer 12 is preferably 0.001 μm or more and less than 10 μm, more preferably 0.01 μm or more and less than 5 μm, and still more preferably 0.1 μm or more and less than 2 μm. In order to prevent reaction between a workpiece and the diamond base material, a sufficient thickness of stable layer 12 is 0.001 μm to 0.01 μm. However, in view of the fact that stable layer 12 also wears, the thickness of stable layer 12 is preferably 0.1 μm or more and less than 2 μm, in order to extend the life. In order to keep high the heat dissipation effect of composite diamond body 10, the thickness of stable layer 12 having lower thermal conductivity than diamond base material 11 is preferably less than 10 μm.

Figure 2:
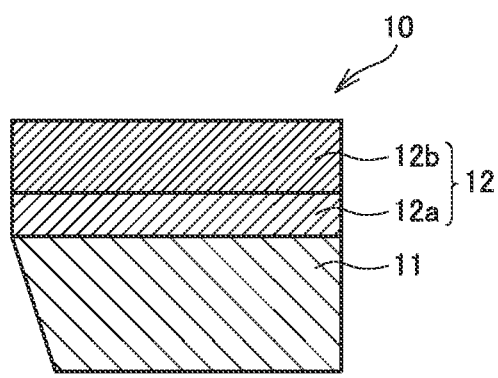
FIG. 2 is a schematic cross-sectional view showing another example of the composite diamond body in accordance with an aspect of the present invention.
Figure 3:
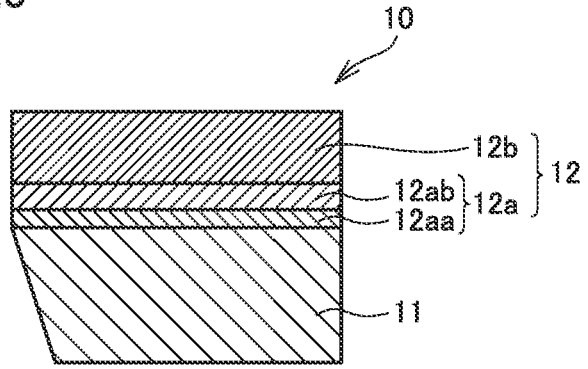
FIG. 3 is a schematic cross-sectional view showing still another example of the composite diamond body in accordance with an aspect of the present invention.

As shown in FIGS. 2 and 3, stable layer 12 includes a plurality of layers (an inner stable layer 12a and an outer stable layer 12b for example), in order to increase adhesion between diamond base material 11 and stable layer 12. The plurality of layers include inner stable layer 12a and outer stable layer 12b located in order from the side of diamond base material 11. As shown in FIG. 3, inner stable layer 12a may further include an innermost stable layer 12aa and an intermediate inner stable layer 12ab which are located in order from the side of diamond base material 11. In this stable layer 12, inner stable layer 12a can increase adhesion with diamond base material 11 and outer stable layer 12b can prevent reaction with a workpiece and thereby increase the wear resistance.

In the case where stable layer 12 includes inner stable layer 12a at the side of diamond base material 11, inner stable layer 12a is preferably a layer containing at least one kind of metal selected from the group consisting of ruthenium (Ru), osmium (Os), rhodium (Rh), iridium (Ir), palladium (Pd), and platinum (Pt), in order to have high adhesion between inner stable layer 12a and diamond base material 11. For example, preferably inner stable layer 12a is a layer containing a stable refractory metal such as ruthenium (Ru) and outer stable layer 12b is a layer containing a stable hard metal such as tungsten (W).

In the case where stable layer 12 includes inner stable layer 12a at the side of diamond base material 11, inner stable layer 12a is preferably a layer containing at least one kind of carbide selected from the group consisting of tungsten carbide (WC), tantalum carbide (TaC), molybdenum carbide (MoC), niobium carbide (NbC), vanadium carbide (VC), chromium carbide (CrC), titanium carbide (TiC), zirconium carbide (ZrC), hafnium carbide (HfC), and silicon carbide (SiC), in order to have high adhesion between inner stable layer 12a and diamond base material 11. For example, preferably inner stable layer 12a is a layer containing a stable carbide such as WC and outer stable layer 12b is a layer containing a stable hard metal such as tungsten (W). In the case where inner stable layer 12a includes innermost stable layer 12aa and intermediate inner stable layer 12ab in order from the side of diamond base material 11, preferably innermost stable layer 12aa and intermediate inner stable layer 12ab are both layers containing a stable carbide such as tungsten carbide (WC), innermost stable layer 12aa contains a stable carbide having a high carbon content, and intermediate inner stable layer 12ab contains a stable carbide having a lower carbon content than innermost stable layer 12aa.

Figure 4:
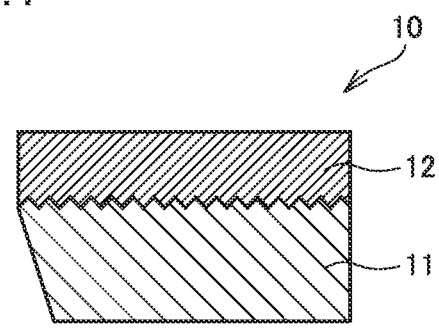
FIG. 4 is a schematic cross-sectional view showing a further example of the composite diamond body in accordance with an aspect of the present invention.

As shown in FIG. 4, the surface of diamond base material 11 that forms the interface between diamond base material 11 and stable layer 12 is preferably rough, namely have a large arithmetic average roughness Ra, in order to increase the adhesion between diamond base material 11 and stable layer 12. However, in order to increase the surface flatness of stable layer 12, diamond base material 11 has an arithmetic average roughness Ra satisfying a relation, with the thickness T of the stable layer, of preferably $10 \times Ra < T$, more preferably $100 \times Ra < T$. In the case where the surface is extremely uneven and the protrusions having an aspect ratio of more than 2 occupy 10% or more of the surface, the surface feature is preferably represented by P-V (heights of peak and valley) value Vpv rather than arithmetic average roughness Ra. In this case, the P-V value Vpv preferably satisfies a relation, with the thickness T of the stable layer, of preferably $Vpv < T$, more preferably $10 \times Vpv < T$.

Diamond Surface Layer

Figure 7:
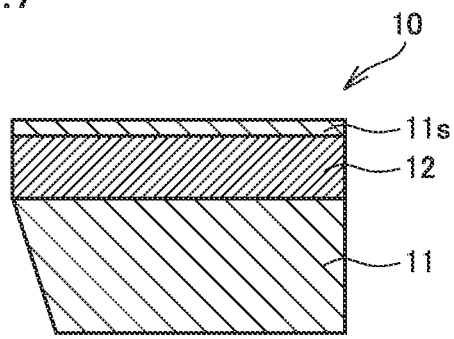
FIG. 7 is a schematic cross-sectional view showing a further example of the composite diamond body in accordance with an aspect of the present invention.
Figure 8:
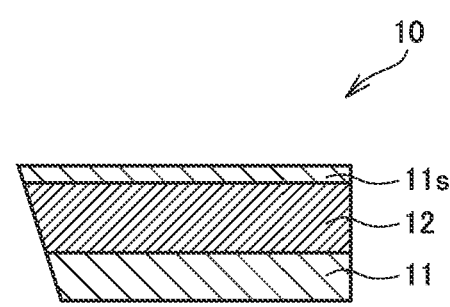
FIG. 8 is a schematic cross-sectional view showing a further example of the composite diamond body in accordance with an aspect of the present invention.
Figure 9:
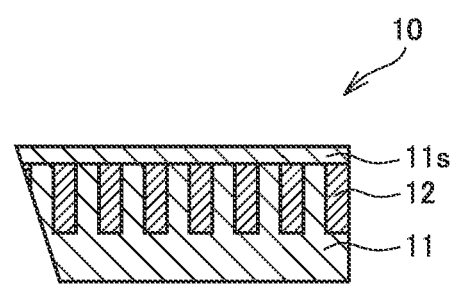
FIG. 9 is a schematic cross-sectional view showing a further example of the composite diamond body in accordance with an aspect of the present invention.

As shown in FIGS. 7 to 9, composite diamond body 10 of the present embodiment may have a diamond surface layer 11s with a thickness of 5.0 μm or less, preferably 1.0 μm or less, on stable layer 12. Even when composite diamond body 10 includes diamond surface layer 11s having a thickness of 5.0 μm or less, preferably 1.0 μm or less, the presence of stable layer 12 under the diamond surface layer enables the composite diamond body to be used for machining a workpiece. Composite diamond body 10 having such a diamond surface layer 11s is formed by implanting ions in a region of diamond base material 11 that is located from a depth of 5 μm or less from the surface of diamond base material 11 to a deeper position (see FIG. 8) as described later herein. Alternatively, it is formed by implanting ions from the surface toward the inside of diamond base material 11 and thereafter growing diamond surface layer 11s to a thickness of less than 5.0 μm. Such a composite diamond body 10 is suitably used for a workpiece made of an oxide or any of insulating materials other than oxide. The outermost diamond layer on the composite diamond body is more preferably electrically conductive when evaluation is done with probes erected at any two locations of the surface, for sensing the contact with a workpiece and preventing charging. Preferably, the electrical conductivity including contact resistance is more than $10^{-7}$ S (resistance value is less than 10 MΩ). The value of the electrical conductivity is an average electrical conductivity value calculated from current and voltage when a common BeCu-based material is used for a prove a and measurements are taken at room temperature (25° C.) and 50 V, and determining the average from current and voltage.

Formation of Stable Layer by Deposition

As shown in FIGS. 1 to 4, at least one layer of stable layer 12 is preferably a deposited layer disposed on diamond base material 11, in order to form stable layer 12 with low reactivity with a workpiece and high adhesion with diamond base material 11, without being particularly limited. Such a deposited layer can be formed by deposition on diamond base material 11. The method for depositing stable layer 12 on diamond base material 11 is not particularly limited as long as the method is suitable for formation of any of various stable layers 12 (layer containing a stable hard metal, a layer containing a stable refractory metal, a layer containing a stable carbide, a layer containing a stable nitride, and the like, for example). However, in order to efficiently form a stable layer with a flat surface and high quality, preferably a PVD (physical vapor deposition) method such as vapor deposition, sputtering, arc, HiPIMS (High Power Impulse Magnetron Sputtering) method or the like is suitably used. In order to enable a high-quality layer with good adhesion with diamond base material 11 to be formed, sputtering method and HiPIMS method are preferably used. The CVD (Chemical Vapor Deposition) method is also suitably used. For formation of a layer containing the stable carbide, the CVD method is preferred.

As shown in FIGS. 2 and 3, in the case where stable layer 12 includes a plurality of layers (inner stable layer 12a and outer stable layer 12b for example), the method for depositing stable layer 12 as described above may be used to form inner stable layer 12a (innermost stable layer 12aa and intermediate inner stable layer 12ab) on diamond base material 11 and thereafter form outer stable layer 12b on inner stable layer 12a (intermediate inner stable layer 12ab).

As shown in FIG. 4, in order to increase adhesion between the diamond base material and stable layer 12, preferably the surface of diamond base material 11 is roughened, namely arithmetic average roughness Ra of the surface of diamond base material 11 is increased, before deposition of stable layer 12 on diamond base material 11. Particularly in the case where diamond base material 11 is formed of single crystal diamond, the surface of the diamond has high flatness and therefore it is highly necessary to increase the adhesion between the diamond base material and stable layer 12. However, in order to increase the flatness of the surface of stable layer 12, arithmetic average roughness Ra of the surface of diamond base material 11 has a relation, with the thickness T of the stable layer, of preferably 10×Ra<T, more preferably 100×Ra<T. In the case where the surface is extremely uneven and the protrusions having an aspect ratio of more than 2 occupy more than 10% of the surface, the surface feature is preferably represented by P-V (heights of peak and valley) value Vpv rather than arithmetic average roughness Ra. In this case, the P-V value Vpv preferably satisfies a relation, with the thickness T of the stable layer, of preferably Vpv<T, more preferably 10×Vpv<T.

Formation of Stable Layer by Ion Implantation

Figure 5:
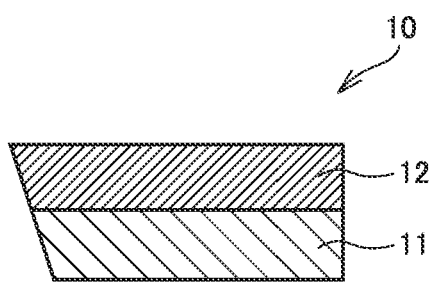
FIG. 5 is a schematic cross-sectional view showing a further example of the composite diamond body in accordance with an aspect of the present invention.

As shown in FIGS. 4 and 5, at least one layer of stable layer 12 is preferably an ion-implanted layer located in at least a part of the inner region from the surface of diamond base material 11, in order to form stable layer 12 with low reactivity with a workpiece and high adhesion with diamond base material 11, without being particularly limited. Such an ion implantation layer can be formed by implanting ions in diamond base material 11. Stable layer 12 formed by such ion implantation has high adhesion with diamond base material 11.

The ion implantation energy may be 200 keV to several MeV, depending on the kind of element of ions to be implanted. The depth of implanted ions is preferably 0.001 μm or more and less than 5 μm, where the depth is the depth at the highest ion concentration. It is difficult in terms of the apparatus and physical aspect to have a depth at the highest ion concentration of 5 μm or more from the surface of diamond base material 11. However, if necessary, the diamond layer may be additionally grown after ion implantation to have a depth, from the surface of diamond base material 11, of 5 μm or more. The element of implanted ions preferably includes at least one kind of element selected from the group consisting of tungsten (W), tantalum (Ta), molybdenum (Mo), niobium (Nb), chromium (Cr), vanadium (V), and silicon (Si), because a carbide with a higher hardness than iron can be formed. After the implantation, annealing may be performed to increase the strength.

The element of ions to be implanted may include at least one kind of element selected from the group consisting of palladium (Pd), ruthenium (Ru), platinum (Pt), and iridium (Ir). Such an element does not form a carbide but is present in the form of separate atoms. In this case, annealing is less effective.

For formation of stable layer 12 by ion implantation, one stable layer may be formed by performing ion implantation once. However, it is preferable to form a plurality of stable layers in the thickness direction by ion implantation performed multiple times with different energies. Preferably the dose is adjusted so that the atomic density of the element of implanted ions falls in a range of $1\times10^{19}$ cm$^{-3}$ to $1\times10^{22}$ cm$^{-3}$. More preferably the dose is adjusted so that the atomic density of the element of implanted ions falls in a range of $1\times10^{21}$ cm$^{-3}$ to $1\times10^{22}$ cm$^{-3}$. Even when the ion implantation energy is somewhat high to leave a diamond layer as the outermost layer, there arises no problem as long as the thickness of the remaining diamond surface layer is 5.0 μm or less, preferably 1.0 μm or less, and still more preferably 0.5 μm or less. Even when the diamond surface layer reacts with a workpiece to be eventually worn, the presence of stable layer 12 under the diamond surface layer enables long-term use.

After the stable layer is formed by ion implantation in the diamond base material, another stable layer may be formed by deposition on the ion-implanted stable layer, which, however, is not shown. In such a case, the ion-implanted stable layer is the inner stable layer and the deposited stable layer is the outer stable layer.

Figure 6:
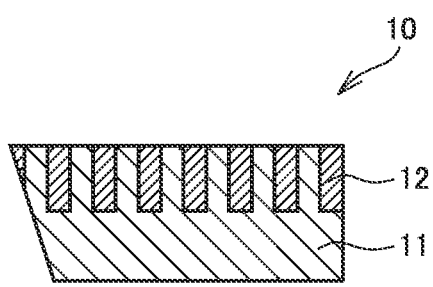
FIG. 6 is a schematic cross-sectional view showing a further example of the composite diamond body in accordance with an aspect of the present invention.

As shown in FIGS. 6 and 9, in order for composite diamond body 10 to have a stable layer with low reactivity with a workpiece and high adhesion with the diamond base material, stable layer 12 which is the above-described ion-implanted layer can be made up of separate portions located in respective multiple regions each having a diameter of less than 1 μm as seen in the direction perpendicular to the surface of diamond base material 11.

Formation of Stable Layer or Improvement of its Adhesion with Diamond Base Material by Annealing In composite diamond body 10 of the present embodiment, in order to form stable layer 12 with low reactivity with a workpiece and high adhesion with diamond base material 11, stable layer 12 preferably includes at least one layer which is an annealed layer disposed in a position on the diamond base material and a position in the inner region from the surface of the diamond base material to occupy at least a part of the diamond base material, without being particularly limited. Such an annealed layer can be formed by performing annealing at a temperature of 1000° C. or less after formation of the deposited layer or ion-implanted layer as described above. Even when this annealing does not form a distinct annealed layer, the adhesion between diamond base material 11 and stable layer 12 can be increased by this annealing. Particularly in the case where diamond base material 11 is formed of a single crystal diamond, the high surface flatness makes it highly necessary to increase the adhesion between the diamond base material and stable layer 12.

Moreover, as shown in FIGS. 1 to 4, after a layer containing the stable hard metal or a layer containing the stable refractory metal is formed by deposition as stable layer 12, annealing may be performed at a temperature of 1000° C. or less in a nitrogen-containing atmosphere to thereby obtain the layer containing the stable nitride, and annealing may be performed at a temperature of 1000° C. or less in an oxygen-containing atmosphere to thereby obtain the layer containing the stable oxide.

The annealing forms a carbide at the interface between diamond base material 11 and stable layer 12. This carbide forms inner stable layer 12a, and the stable layer in which the carbide is not formed is outer stable layer 12b. Removal of outer stable layer 12b leaves inner stable layer 12a which is a carbide layer in which the carbide is formed and which then serves as a new stable layer. Inner stable layer 12a formed at the interface with diamond base material 11 by this annealing is a very thin carbide layer having a thickness of 100 nm and high adhesion with diamond base material 11.

While the foregoing description of composite diamond body 10 of the present embodiment is mainly about its characteristics for preventing or suppressing reaction between the diamond base material and iron (Fe), they are applicable as well to nickel (Ni), cobalt (Co), and the like.

Moreover, composite diamond body 10 of the present embodiment is also applicable as well to oxides and the like. Specifically, diamond which is susceptible to oxygen (O) is not good at machining oxides. Therefore, the diamond base material can be covered with the stable layer of carbide, nitride, oxide, or the like to prevent or suppress reaction between the diamond base material and oxygen. In this case, a stable layer containing carbide, nitride, oxide, or the like is more effective than a stable layer containing a metal which may be oxidized.

Stable layer 12 as shown in FIGS. 1 to 9 and containing any of the aforementioned stable hard metal, stable refractory metal, stable carbide, stable nitride, stable oxide, and stable oxynitride serves as an electron supply portion which supplies electrons to diamond base material 11, stable layer 12, and diamond surface layer 11s. Therefore, stable layer 12 and diamond surface layer 11s can be prevented from being further worn due to the fact that stable layer 12 and diamond surface layer 11s contacting a workpiece of iron or oxide are deprived of electrons by the workpiece. The wear resistance of stable layer 12 and diamond surface layer 11s is thus increased.

Figure 10:
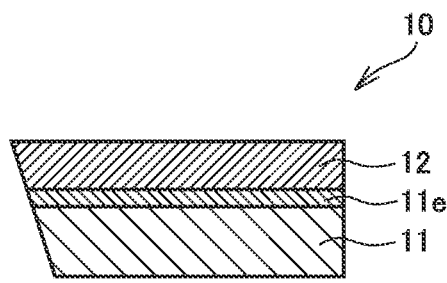
FIG. 10 is a schematic cross-sectional view showing a further example of the composite diamond body in accordance with an aspect of the present invention.
Figure 11:
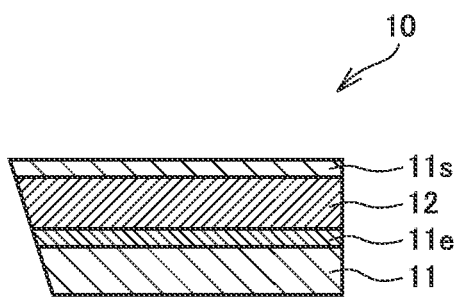
FIG. 11 is a schematic cross-sectional view showing a further example of the composite diamond body in accordance with an aspect of the present invention.

Further, as shown in FIGS. 10 and 11, it is preferable to form an electron supply layer 11e as the electron supply portion within composite diamond body 10, preferably within diamond base material 11 contacting stable layer 12. Such an electron supply layer 11e enhances the ability of stable layer 12 and diamond surface layer 11s to cut oxides. Electron supply layer 11e is a layer containing the SP2 component of carbon (C) for example, and specifically a graphite layer. Since the graphite layer having π bonds is regarded as a very soft material, the base material including the graphite layer exposed outward is not a suitable base material. Preferably the electron supply layer is formed inside the diamond base material, has the surface formed of diamond, and is still capable of supplying electrons from inside. It is therefore preferable to implant ions to thereby form the electron supply layer located inside the diamond base material and serving as an electron supply portion. Ions of an element which is to form a carbide may be implanted to the diamond base material to produce a carbide layer which is formed by carbonation of the ion-implanted portion. This carbide layer serves as the electron supply portion and also as the stable layer. Moreover, an element which is not to form a carbide may be implanted to the diamond base material to produce a layer containing SP2 components of carbon in the ion-implanted portion. This layer serves as the electron supply portion supplying electrons to the stable layer and/or the diamond surface layer located thereon and thereby making it stable.

Atoms for ion implantation to form electron supply layer 11e serving as the electron supply portion within diamond base material 11 are not particularly limited, and boron (B), carbon (C), nitrogen (N), argon (Ar), aluminum (Al), silicon (Si), phosphorus (P), sulfur (S), or the like is suitably used for ion implantation. Apparently atoms of tungsten (W), tantalum (Ta), molybdenum (Mo), niobium (Nb), chromium (Cr), vanadium (V), or the like may also be used for ion implantation. However, a necessary condition is to leave diamond in the outermost layer and generate the electron supply portion in the base material. In view of this, light atoms of elements up to argon (Ar) are preferred. This is for the reason that atoms heavier than argon (Ar) atoms may break the diamond of the outermost surface.

The composite diamond body applicable to machining of oxides as described above is also applicable to machining of resins, since the above-described structure supplying electrons can easily cut carbon bonds in resin. While diamond has a significantly higher hardness than the composite diamond body, the diamond additionally having a structure for supplying electrons through the diamond serves as a further excellent tool.

In the case where the electron supply portion inside the diamond base material is formed by ion implantation, the depth of ion implantation is preferably 0.001 μm or more, more preferably 0.01 μm or more, and still more preferably 0.1 μm or more. The conditions can be set by a Monte Carlo simulation like TRIM. The dose is preferably $1 \times 10^{15}$ cm$^{-2}$ or more, for the sake of supplying electrons.

Second Embodiment: Composite Diamond Tool

Figure 12:
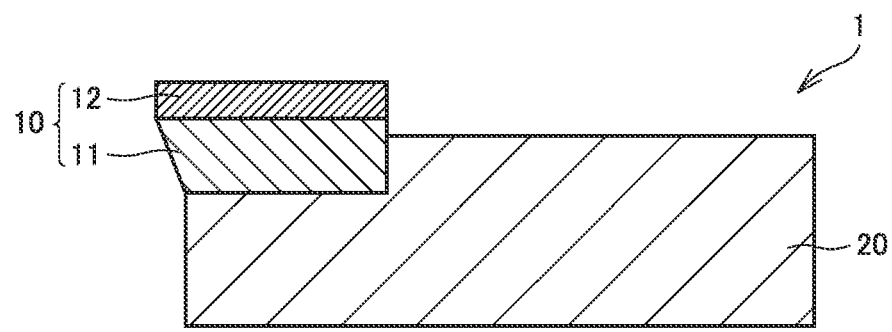
FIG. 12 is a schematic cross-sectional view showing an example of the composite diamond tool in accordance with another aspect of the present invention.

As shown in FIG. 12, a composite diamond tool 1 of the present embodiment includes composite diamond body 10 of the first embodiment. More specifically, composite diamond tool 1 of the present embodiment includes a shank 20 of the tool and composite diamond body 10 of the first embodiment disposed on shank 20, and composite diamond body 10 is disposed so that its stable layer 12 is brought into contact with a workpiece. Since composite diamond tool 1 of the present embodiment includes composite diamond body 10 of the first embodiment, the tool can machine workpieces for a long period of time and is applicable to mirror-finish planarization of a workpiece.

Composite diamond tool 1 of the present embodiment is not particularly limited as long as the composite diamond tool includes composite diamond body 10 of the first embodiment and composite diamond body 10 is disposed so that its stable layer 12 is brought into contact with a workpiece. The composite diamond tool may for example be cutting tool, dresser, end mill, or the like.

The procedure for forming the stable layer for manufacturing composite diamond tool 1 of the present embodiment is not particularly limited. However, for the sake of facilitating manufacture of the tool, it is preferable to mount diamond base material 11 on shank 20 of the tool, and thereafter form stable layer 12 by deposition or ion implantation so as to form composite diamond body 10. It should be noted that composite diamond body 10 may be produced first by forming stable layer 12 on diamond base material 11 through deposition or ion implantation and thereafter composite diamond body 10 may be attached to shank 20 of the tool, from which no problem in terms of characteristics arises, except for difficulty of the manufacture.

EXAMPLES

Example 1

A single crystal diamond base material produced by vapor-phase synthesis (specifically CVD) was machined into a cutting insert and the cutting insert was brazed to a shank at 900° C. to thereby prepare a diamond cutting tool. On the single crystal diamond base material forming the cutting insert, a tungsten (W) layer having a thickness of 1 µm was formed as a stable layer by the vapor deposition method. Subsequently, in a vacuum at the ultimate vacuum achieved by a rotary pump, annealing was performed for one hour at 700° C. which was lower than the brazing temperature. At the interface between the diamond base material and the stable layer, tungsten carbide (WC) was formed. Tungsten (W) remained as it was in the surface of the stable layer. The tool of this Example obtained in this way was used to cut a cast iron at a rate of 800 m/min, to be compared with a diamond tool (Comparative Example) having no coating on the diamond base material. The life of the tool was defined as coming to an end when the amount of wear of a tool part contacting the cast iron reached 1 µm. Then, the life of the coated diamond tool of this Example was five times as long as that of the diamond tool of the Comparative Example.

Example 2

A single crystal diamond base material produced by vapor-phase synthesis (specifically CVD) was machined into a cutting insert and the cutting insert was brazed to a shank at 900° C. to thereby prepare a diamond cutting tool. On the single crystal diamond base material forming the cutting insert, a stable layer was formed, namely a titanium (Ti) layer having a thickness of 0.05 µm was formed first by the HiPIMS method and thereafter a titanium nitride (TiN) layer having a thickness of 1 µm was formed by the HiPIMS method. Subsequently, in a vacuum at the ultimate vacuum achieved by a rotary pump, annealing was performed for one hour at 700° C. which was lower than the brazing temperature. The annealing increased the adhesion force between the diamond base material and the stable layer. The interface between the titanium (Ti) layer and the diamond base material after the annealing was observed with a transmission electron microscope (TEM) to find a titanium carbide (TiC) layer of 35 nm at the interface. The tool of this Example obtained in this way was used to cut a cast iron at a rate of 800 m/min, to be compared with a diamond tool (Comparative Example) having no coating on the diamond base material. The life of the tool was defined as coming to an end when the amount of wear of a tool part contacting the cast iron reached 1 µm. Then, the life of the coated diamond tool of this Example was nine times as long as that of the diamond tool of the Comparative Example.

Example 3

A single crystal diamond base material produced by vapor-phase synthesis (specifically CVD) was machined into a cutting insert and the cutting insert was brazed to a shank at 900° C. to thereby prepare a diamond cutting tool. On the single crystal diamond base material forming the cutting insert, a stable layer was formed, namely a titanium (Ti) layer having a thickness of 0.05 µm was formed first by the HiPIMS method and thereafter an aluminum nitride (AlN) layer having a thickness of 1 µm was formed by the HiPIMS method. Subsequently, in a vacuum at the ultimate vacuum achieved by a rotary pump, annealing was performed for one hour at 700° C. which was lower than the brazing temperature. The annealing increased the adhesion force between the diamond base material and the stable layer. The tool of this Example obtained in this way was used to cut a cast iron at a rate of 800 m/min, to be compared with a diamond tool (Comparative Example) having no coating on the diamond base material. The life of the tool was defined as coming to an end when the amount of wear of a tool part contacting the cast iron reached 1 µm. Then, the life of the coated diamond tool of this Example was ten times as long as that of the diamond tool of the Comparative Example.

Example 4

A single crystal diamond base material produced by vapor-phase synthesis (specifically CVD) was machined into a cutting insert and the cutting insert was brazed to a shank at 900° C. to thereby prepare a diamond cutting tool. On the single crystal diamond base material forming the cutting insert, a stable layer was formed, namely a tungsten carbide (WC) layer having a thickness of 1 µm was formed as a stable layer by the CVD method. Subsequently, in a vacuum at the ultimate vacuum achieved by a rotary pump, annealing was performed for one hour at 700° C. which was lower than the brazing temperature. The annealing increased the adhesion force between the diamond base material and the stable layer. The tool of this Example obtained in this way was used to cut a cast iron at a rate of 800 m/min, to be compared with a diamond tool (Comparative Example) having no coating on the diamond base material. The life of the tool was defined as coming to an end when the amount of wear of a tool part contacting the cast iron reached 1 µm. Then, the life of the coated diamond tool of this Example was eight times as long as that of the diamond tool of the Comparative Example.

Example 5

A single crystal diamond base material produced by vapor-phase synthesis (specifically CVD) was machined into a cutting insert. On the single crystal diamond base material forming the cutting insert, a stable layer was formed by ion implantation of zirconium (Zr) at a dose of $1 \times 10^{17}$ $cm^{-2}$ and with an energy of 400 keV. In a vacuum at the ultimate vacuum achieved by a turbo molecular pump, annealing was performed for one hour at 1200° C. The diamond base material on which the stable layer was formed was brazed to a shank at 900° C. to thereby prepare a diamond cutting tool. The tool of this Example obtained in this way was used to cut a cast iron at a rate of 800 m/min, to be compared with a diamond tool (Comparative Example) having no coating on the diamond base material. The life of the tool was defined as coming to an end when the amount of wear of a tool part contacting the cast iron reached 1 µm. Then, the life of the coated diamond tool of this Example was five times as long as that of the diamond tool of the Comparative Example.

Example 6

A single crystal diamond base material produced by vapor-phase synthesis (specifically CVD) or a single crystal diamond base material produced by high-pressure synthesis was machined into an insert for a cutting tool, and this cutting insert was brazed to a shank at 900° C. to thereby prepare a diamond cutting tool. On the single crystal diamond base material forming the cutting insert, a stable layer was formed. Different combinations of the single crystal diamond base material and the stable layer were used to produce respective Samples 01 to 14. The kind of metal and the thickness as well as the result of a cutting test for each Sample are indicated together in Table 1. For Samples 01 to 04, one metal layer was formed on the base material, and thereafter annealing was performed to form a carbide layer at the interface. The carbide layer formed an inner stable layer. The outer stable layer was still the metal layer. Therefore, the stable layer was a structure made up of at least two layers. For Samples 05 to 07, a titanium (Ti) layer was formed at room temperature (25° C.) on the base material, another metal layer was formed thereon, and thereafter annealing was performed to form a titanium carbide (TiC) layer at the interface with the diamond. While the TiC layer was formed, the remaining part was still the Ti layer. Therefore, the stable layer was a structure made up of at least three layers, namely the TiC layer which was the innermost stable layer in the inner stable layer, the Ti layer which was the intermediate inner stable layer in the inner stable layer, and the metal layer which was the outer stable layer. For Samples 08 and 09, only one metal layer was formed. For Samples 10 and 11, a ruthenium (Ru) layer was formed as an inner stable layer at a substrate temperature of 500° C. on the base material, and another metal layer was formed as an outer stable layer at 300° C. or less on the inner stable layer.

For Samples 12 to 14, a carbide layer was formed as an inner stable layer at a substrate temperature of 500° C. on the base material, and a metal layer was formed as an outer stable layer at 300° C. or less on the inner stable layer. A relatively greater adhesion force was obtained between the inner and outer stable layers in which the metal in the carbide layer formed as the inner stable layer was the same element as the metal of the outermost metal layer formed as the outer stable layer. All the stable layers were formed to have a thickness of substantially 2 μm. All the stable layers were formed by the HiPIMS method. Before the stable layer was formed, the diamond base material was annealed in a vacuum at 800° C. to form a thin graphite (30 nm or less), which enabled the stable layer to be formed more stably. Formation of the stable layer by the HiPIMS method increased the force of adhesion with the diamond. A comparison with the electron beam vapor deposition method and the sputtering method was made. The peeled-off portion after a wear test was 2000 μm$^2$ or more in the case of the electron beam vapor deposition method, while it was 800 μm$^2$ or more in the case of the sputtering method. In contrast, it was less than 80 μm$^2$ in the case of the HiPIMS method. After the stable layer was thus formed, in a vacuum at the ultimate vacuum achieved by a rotary pump, Samples 01 to 07 were annealed for one hour at 700° C. which was lower than the brazing temperature. When the inner stable layer was deposited, it was deposited at a substrate temperature of 500° C. Thus, when the inner stable layer is formed on the diamond base material, the inner stable layer is formed under conditions that promote reaction with the diamond to thereby strengthen the adhesion and prevent peeling. For comparison, a diamond tool with no coating was prepared as Sample 15.

The tools of this Example obtained in this way were subjected to a cutting test in which a cast iron was cut at a rate of 800 m/min. The results are indicated in Table 1. In this Example, the life of the tool was defined as coming to an end when the amount of wear of a tool part (flank face part) contacting the cast iron reached 2 μm. As indicated in Table 1, the coated diamond tools of this Example had a longer life than Sample 15 without coating. It has been found that the coating is effective. The total area of the part where the stable layer had been peeled off after the test was 10 or more and less than 80 μm$^2$ in the case of Samples 08 and 09, and it was less than 10 μm$^2$ in the case of the other Samples.

TABLE 1

| Example 6 | diamond base material | | inner stable layer | | | outer stable layer | | wear resistance life |
|---|---|---|---|---|---|---|---|---|
| | type | feature | kind | formation method | thickness (μm) | kind | thickness (μm) | (times) |
| Sample 01 | CVD | Nx > 1 ppm, (110) | TaC | annealing | 0.05 | Ta | 2 | 2.4 |
| Sample 02 | CVD | Nx > 1 ppm, (110) | VC | annealing | 0.06 | V | 2 | 1.5 |
| Sample 03 | CVD | Nx > 1 ppm, (110) | HfC | annealing | 0.05 | Hf | 2 | 1.8 |
| Sample 04 | CVD | Nx > 1 ppm, (110) | ZrC | annealing | 0.07 | Zr | 2 | 1.5 |
| Sample 05 | CVD | Nx > 1 ppm, (110) | TiC/Ti | annealing after deposition | 0.07 | Mo | 2 | 3 |
| Sample 06 | CVD | Nx > 1 ppm, (110) | TiC/Ti | annealing after deposition | 0.07 | Nb | 2 | 2 |
| Sample 07 | CVD | Nx > 1 ppm, (110) | TiC/Ti | annealing after deposition | 0.07 | Ir | 2 | 2 |
| Sample 08 | CVD | Nx > 1 ppm, (110) | — | — | — | Os | 2 | 3 |
| Sample 09 | CVD | Nx > 1 ppm, (110) | — | — | — | Ru | 2 | 2.5 |
| Sample 10 | CVD | Nx > 1 ppm, (110) | Ru | deposition at 500° C. | 0.08 | W | 2 | 4 |
| Sample 11 | CVD | Nx > 1 ppm, (110) | Ru | deposition at 500° C. | 0.07 | Ta | 2 | 2 |
| Sample 12 | high pressure | Ib (110) | WC | deposition at 500° C. | 0.2 | W | 1.8 | 6 |
| Sample 13 | high pressure | Ib (110) | TaC | deposition at 500° C. | 0.3 | Ta | 1.7 | 3 |
| Sample 14 | high pressure | Ib (110) | MoC | deposition at 500° C. | 0.4 | Mo | 1.6 | 3.5 |
| Sample 15 | high pressure | Ib (110) | none | — | — | none | — | 1 |

Example 7

A single crystal diamond base material produced by vapor-phase synthesis (specifically CVD) or a single crystal diamond base material produced by high-pressure synthesis was machined into an insert for a cutting tool, and this cutting insert was brazed to a shank at 900° C. to thereby prepare a diamond cutting tool. As the single crystal diamond base material produced by vapor-phase synthesis, a base material containing non-substitutional nitrogen at more than 1 ppm was used. On the single crystal diamond base material forming the cutting insert, a stable layer was formed. Different combinations of the single crystal diamond base material and the stable layer were used to produce respective Samples 21 to 32. Respective kinds and respective thicknesses of carbide layers, nitride layers, oxide layers, and oxynitride layer, as well as the result of a cutting test are indicated together in Table 2. For Samples 21 and 22, a ruthenium (Ru) layer was deposited at a substrate temperature of 500° C. on the base material, and thereafter a carbide layer was formed thereon. The Ru layer is an inner stable layer and the carbide layer thereon is an outer stable layer. For Samples 23 to 25, a carbide layer was formed at room temperature (25° C.) on the base material. For Samples 26 to 32, a titanium (Ti) layer was formed at room temperature (25° C.) on the base material, another carbide layer, a nitride layer, or an oxide layer for example was formed thereon, and thereafter annealing was performed to form a titanium carbide (TiC) layer at the interface with the diamond. While the TiC layer was formed, the remaining part was still the Ti layer. Therefore, the stable layer was a material, the inner stable layer is formed under conditions that promote reaction with the diamond to thereby strength the adhesion and prevent peeling. For comparison, a diamond tool with no coating was prepared as Sample 15.

The tools of this Example obtained in this way were subjected to a cutting test in which a cast iron was cut at a rate of 800 m/min. In this Example, the life of the tool was defined as coming to an end when the amount of wear of a tool part (flank face part) contacting the cast iron reached 2 μm. As indicated in Table 2, the coated diamond tools of this Example had a longer life than Sample 15 without coating. It has been found that the coating is effective. The total area of the part where the stable layer had been peeled off after the test was 10 or more and less than 80 μm$^2$ in the case of Samples 23 to 25, and it was less than 10 μm$^2$ in the case of the other Samples.

TABLE 2

| Example 7 | diamond base material | | inner stable layer | | | outer stable layer | | wear resistance life (times) |
|---|---|---|---|---|---|---|---|---|
| | type | feature | kind | formation method | thickness (μm) | kind | thickness (μm) | |
| Sample 21 | CVD | Nx > 1 ppm, (110) | Ru | deposition at 500° C. | 0.08 | WC | 2 | 8 |
| Sample 22 | CVD | Nx > 1 ppm, (110) | Ru | deposition at 500° C. | 0.08 | TaC | 2 | 6 |
| Sample 23 | CVD | Nx > 1 ppm, (110) | — | — | — | TaC | 2 | 5 |
| Sample 24 | CVD | Nx > 1 ppm, (110) | — | — | — | MoC | 2 | 5 |
| Sample 25 | CVD | Nx > 1 ppm, (110) | — | — | — | ZrC | 2 | 4 |
| Sample 26 | CVD | Nx > 1 ppm, (110) | TiC/Ti | annealing after deposition | 0.06 | SiC | 2 | 15 |
| Sample 27 | CVD | Nx > 1 ppm, (110) | TiC/Ti | annealing after deposition | 0.06 | TiN | 2 | 7 |
| Sample 28 | CVD | Nx > 1 ppm, (110) | TiC/Ti | annealing after deposition | 0.06 | ZrN | 2 | 6 |
| Sample 29 | CVD | Nx > 1 ppm, (110) | TiC/Ti | annealing after deposition | 0.06 | Al$_2$O$_3$ | 2 | 11 |
| Sample 30 | high pressure | Ib (110) | TiC/Ti | annealing after deposition | 0.06 | HfN | 2 | 5.5 |
| Sample 31 | high pressure | Ib (110) | TiC/Ti | annealing after deposition | 0.06 | Al$_2$O$_3$ | 2 | 10 |
| Sample 32 | high pressure | Ib (110) | TiC/Ti | annealing after deposition | 0.06 | SiAlON | 2 | 12 |
| Sample 15 | high pressure | Ib (110) | none | — | — | none | — | 1 | structure made up of at least three layers, namely the TiC layer which was the innermost stable layer in the inner stable layer, the Ti layer which was the intermediate inner stable layer in the inner stable layer, and metal layer which was the outer stable layer. All the stable layers were formed to have a thickness of substantially 2 μm. All the stable layers were formed by the HiPIMS method. The treatment and adhesion before this method was performed were those described above in connection with Example 6. For carbides and nitrides of Samples 21 to 25 and 27 to 31, the metal content was set higher than the stoichiometric ratio by 1 to 4 atm % (for WC, W was 50.5 to 52 mol %, for Al$_2$O$_3$, Al was 40.4 to 41.6 atm %) and electrical conductivity higher than 10$^{-9}$ S/cm (resistivity lower than 10$^9$ Ωcm) to increase the toughness. Then, the test was conducted. The composition was examined by taking measurements at five different positions by the X-ray Photoelectron Spectroscopy (XPS) or Electron Probe Micro Analysis (EPMA) and calculating the average of them. The resistivity was calculated by forming a film on a Cu substrate under the same conditions and forming a Ti electrode with a diameter of 1 mm through a metal mask, and the value of current when 50 V was applied between the Cu substrate and the Ti electrode. For Samples 21 and 22, the inner stable layer was deposited at a substrate temperature of 500° C. For Samples 26 to 32, in a vacuum at the ultimate vacuum achieved by a rotary pump, annealing was performed for one hour at 700° C. which was lower than the brazing temperature, after the stable layer was formed. Thus, when the inner stable layer is formed on the diamond base Example 8

A single crystal diamond base material produced by vapor-phase synthesis (specifically CVD) was machined into an insert for a cutting tool. On the single crystal diamond base material forming the cutting insert, ion implantation was performed to form a stable layer. Depending on implantation conditions, the outermost layer was still formed by the diamond layer in some cases. Different combinations for ion implantation were used to prepare Samples 41 to 48. For Samples 41 to 45, in a vacuum at the ultimate vacuum achieved by a common turbo molecular pump after the ion implantation, annealing was performed for one hour at 1000° C. The outermost surface was formed by remaining crystalline diamond. Other conditions are indicated in Table 3. For Samples 46 to 48, in a vacuum at the ultimate vacuum achieved by a common turbo molecular pump after the ion implantation, annealing was performed for two hours at 1200° C. The outermost surface was not formed by remaining crystalline diamond. Most of the implanted metal formed a carbide. Other conditions are indicated in Table 3. The single crystal diamond base material on which the stable layer was formed was brazed to a shank at 900° C. to thereby prepare a diamond cutting tool. The tool of this Example obtained in this way was used to cut a cast iron at a rate of 800 m/min. The life of the tool was defined as coming to an end when the amount of wear of a tool part (flank face part) contacting the cast iron reached 1 μm. Then, the life of the coated diamond tool of this Example was longer than a comparative example, namely Sample 15. It has been found that the formation of the stable layer is effective. The total area of the part where the stable layer had been peeled off after the test was less than 10 μm² in all Samples. The electrical conductivity value (resistance value) of the outermost layer was evaluated by applying 50 V at room temperature (25° C.) with a two-terminal probe. As to Samples 41 to 45, the electrical conductivity value was higher than 1 μS (resistance value was less than 1 MΩ). For Samples 46 to 48, the electrical conductivity value was higher than 1 mS (resistance value was less than 1 kΩ).

material on which the stable layer was formed was brazed to a shank at 900° C. to thereby prepare a diamond cutting tool. The tool of this Example obtained in this way was used to cut a cast iron at a rate of 800 m/min. The life of the tool was defined as coming to an end when the amount of wear of a tool part (flank face part) contacting the cast iron reached 1 μm. Then, the life of the coated diamond tool of this Example was longer than a comparative example, namely Sample 15, as indicated in Table 4. It has been found that the

TABLE 3

| Example 8 | diamond base material | | implanted element | | | annealing | surface diamond layer | | wear |
|---|---|---|---|---|---|---|---|---|---|
| | type | feature | kind | energy (keV) | dose (cm²) | (temperature) × (time) | present or absent | thickness (μm) | resistance life (times) |
| Sample 41 | CVD | Nx > 1 ppm, (110) | B | 380 | 1 × 10¹⁶ | 1000° C. × 1 h | present | 0.3 | 3 |
| Sample 42 | CVD | Nx > 1 ppm, (110) | B, N | 380 | 1 × 10¹⁶ | 1000° C. × 1 h | present | 0.3 | 3.5 |
| Sample 43 | CVD | Nx > 1 ppm, (110) | Si | 380 | 1 × 10¹⁶ | 1000° C. × 1 h | present | 0.1 | 5 |
| Sample 44 | CVD | Nx > 1 ppm, (110) | P | 380 | 1 × 10¹⁶ | 1000° C. × 1 h | present | 0.1 | 4.3 |
| Sample 45 | CVD | Nx > 1 ppm, (110) | S | 380 | 1 × 10¹⁶ | 1000° C. × 1 h | present | 0.1 | 4.3 |
| Sample 46 | CVD | Nx > 1 ppm, (110) | W | 380 | 1 × 10¹⁷ | 1200° C. × 2 h | absent | — | 4.5 |
| Sample 47 | CVD | Nx > 1 ppm, (110) | Ta | 380 | 1 × 10¹⁷ | 1200° C. × 2 h | absent | — | 4 |
| Sample 48 | CVD | Nx > 1 ppm, (110) | Mo | 380 | 1 × 10¹⁷ | 1200° C. × 2 h | absent | — | 3.5 |
| Sample 15 | high pressure | Ib (110) | none | — | — | — | — | — | 1 |

Example 9

A single crystal diamond base material produced by vapor-phase synthesis (specifically CVD) was machined into an insert for a cutting tool. On the single crystal diamond forming the cutting insert, a mask was formed in which holes each having a diameter of 0.3 μm were arranged at a pitch of 0.6 μm in the shape of a rectangular lattice. Ion implantation was performed through these holes to form a stable layer. The stable layer was implanted in the diamond base material in the dot pattern. The mask was removed after the ion implantation. Conditions for the ion implantation are indicated in Table 4. In this way, Samples 51 to 58 were prepared. For Samples 51 to 55, in a vacuum at the ultimate vacuum achieved by a common turbo molecular pump after the ion implantation, annealing was performed for one hour at 1000° C. For Samples 56 to 58, in a vacuum at the ultimate vacuum achieved by a common turbo molecular pump after the ion implantation, annealing was performed for two hours at 1200° C. The single crystal diamond base partial formation of the stable layer is effective. The total area of the part where the stable layer had been peeled off after the test was less than 10 μm² in all Samples. The electrical conductivity value (resistance value) of the outermost layer was evaluated by applying 50 V at room temperature (25° C.) with a two-terminal probe. As to Samples 51 to 55, the electrical conductivity value was higher than 1 μS (resistance value was less than 1 MΩ). For Samples 56 to 58, the electrical conductivity value was higher than 1 mS (resistance value was less than 1 kΩ).

TABLE 4

| Example 9 | diamond base material | | implanted element | | | annealing | surface diamond layer | | wear |
|---|---|---|---|---|---|---|---|---|---|
| | type | feature | kind | energy (keV) | dose (cm⁻²) | (temperature) × (time) | present or absent | thickness (μm) | resistance life (times) |
| Sample 51 | CVD | Nx > 6 ppm, (110) | B | 380 | 5 × 10¹⁵ | 1000° C. × 1 h | present | 0.3 | 3.4 |
| Sample 52 | CVD | Nx > 6 ppm, (110) | C | 380 | 5 × 10¹⁵ | 1000° C. × 1 h | present | 0.3 | 2.6 |
| Sample 53 | CVD | Nx > 6 ppm, (110) | Si | 380 | 5 × 10¹⁵ | 1000° C. × 1 h | present | 0.1 | 4.3 |
| Sample 54 | CVD | Nx > 6 ppm, (110) | P | 380 | 5 × 10¹⁵ | 1000° C. × 1 h | present | 0.1 | 4.7 |
| Sample 55 | CVD | Nx > 6 ppm, (110) | S | 380 | 5 × 10¹⁵ | 1000° C. × 1 h | present | 0.1 | 4.8 |
| Sample 56 | CVD | Nx > 1 ppm, (110) | W | 380 | 5 × 10¹⁶ | 1200° C. × 2 h | absent | — | 3 |
| Sample 57 | CVD | Nx > 1 ppm, (110) | Ta | 380 | 5 × 10¹⁶ | 1200° C. × 2 h | absent | — | 2 |
| Sample 58 | CVD | Nx > 1 ppm, (110) | Mo | 380 | 5 × 10¹⁶ | 1200° C. × 2 h | absent | — | 2 |
| Sample 15 | high pressure | Ib (110) | none | — | — | — | — | — | 1 |

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

1 composite diamond tool; 11 diamond base material; 11*e* electron supply layer; 11*s* diamond surface layer; 12 stable layer; 12*a* inner stable layer; 12*aa* innermost stable layer; 12*ab* intermediate inner stable layer; 12*b* outer stable layer; 20 shank

The invention claimed is:

1. A composite diamond body comprising:
a diamond base material; and
at least one stable layer disposed in at least one of
   a position on the diamond base material and
   a position in an inner region from a surface of the diamond base material to occupy at least a part of the diamond base material, wherein
the stable layer includes at least one layer which is an ion-implanted layer disposed in the inner region from the surface of the diamond base material to occupy at least a part of the diamond base material, wherein the ion-implanted layer includes separate portions located in respective multiple regions each having a diameter of less than 1 μm as seen in a direction perpendicular to the surface of the diamond base material.

2. A composite diamond body comprising:
a diamond base material; and
at least one stable layer disposed in at least one of
   a position on the diamond base material and
   a position in an inner region from a surface of the diamond base material to occupy at least a part of the diamond base material, wherein
the stable layer includes a plurality of layers,
the plurality of layers includes an inner stable layer and an outer stable layer located in order from the side of the diamond base material,
the inner stable layer includes at least one kind of metal selected from the group consisting of ruthenium, osmium, rhodium, iridium, palladium, and platinum, and
the outer stable layer includes at least one kind of metal selected from the group consisting of tungsten, tantalum, molybdenum, niobium, vanadium, chromium, titanium, zirconium, and hafnium, wherein
the stable layer includes at least one layer which is an ion-implanted layer disposed in the inner region from the surface of the diamond base material to occupy at least a part of the diamond base material, and
the ion-implanted layer includes separate portions located in respective multiple regions each having a diameter of less than 1 μm as seen in a direction perpendicular to the surface of the diamond base material.

\* \* \* \* \*